US012407322B2

(12) United States Patent
Ayazi et al.

(10) Patent No.: US 12,407,322 B2
(45) Date of Patent: Sep. 2, 2025

(54) ACOUSTICALLY DECOUPLED MEMS DEVICES

(71) Applicant: Georgia Tech Research Corporation, Atlanta, GA (US)

(72) Inventors: Farrokh Ayazi, Atlanta, GA (US); Benoit Hamelin, Atlanta, GA (US); Jeremy Yang, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 22 days.

(21) Appl. No.: 18/451,675

(22) Filed: Aug. 17, 2023

(65) Prior Publication Data

US 2024/0030887 A1    Jan. 25, 2024

Related U.S. Application Data

(63) Continuation of application No. 16/977,827, filed as application No. PCT/US2019/020752 on Mar. 5, 2019, now Pat. No. 11,777,468.

(Continued)

(51) Int. Cl.
*H03H 9/02* (2006.01)
*G01C 19/5698* (2012.01)
(Continued)

(52) U.S. Cl.
CPC ..... *H03H 9/02433* (2013.01); *G01C 19/5698* (2013.01); *H03H 9/02338* (2013.01); *H03H 9/2436* (2013.01); *H03H 2009/0244* (2013.01)

(58) Field of Classification Search
CPC .. H02N 1/00; H03H 9/02433; H03H 9/02338; H03H 9/2436; H02H 2009/0244
(Continued)

(56) References Cited

U.S. PATENT DOCUMENTS

2007/0220971 A1* 9/2007 Ayazi ................ G01C 19/5698
73/504.02
2012/0280594 A1* 11/2012 Chen ..................... H10N 30/88
310/313 R
(Continued)

FOREIGN PATENT DOCUMENTS

JP          2008211392 A  *  9/2008
JP          2010028772 A  *  2/2010
(Continued)

OTHER PUBLICATIONS

English Machine Translation JP2017142154 (Year: 2017).*

*Primary Examiner* — Jose A Gonzalez Quinones
(74) *Attorney, Agent, or Firm* — Troutman Pepper Locke LLP; Ryan A. Schneider; Korbin Blunck

(57) ABSTRACT

A resonator element of the monocrystalline 4H or 6H polytype of silicon carbide. A MEMS device including the resonator element and a substrate, wherein the resonator element and the substrate are not coplanar, and acoustic decoupling of the resonator element and the substrate is at least partially dependent upon a degree to which the resonator element and the substrate are not coplanar. A MEMS gyroscope including the resonator element, a substrate, one or more electrodes disposed proximate the resonator element, and a capacitive gap disposed between each electrode and the resonator element. A MEMS device including the resonator element having has a Q greater than 1,000,000, a phononic crystal substrate, and a gap disposed between a perimeter edge of the resonator element and the phononic crystal substrate, wherein acoustic decoupling of the resonator element and the phononic crystal substrate is at least partially dependent upon a size of the gap.

21 Claims, 13 Drawing Sheets

Related U.S. Application Data

(60) Provisional application No. 62/638,494, filed on Mar. 5, 2018.

(51) Int. Cl.
*H02N 1/00* (2006.01)
*H03H 9/24* (2006.01)

(58) Field of Classification Search
USPC .......................................................... 310/309
See application file for complete search history.

(56) References Cited

U.S. PATENT DOCUMENTS

| | | | | |
|---|---|---|---|---|
| 2013/0160578 A1* | 6/2013 | Najafi | .................... | G01C 19/28 |
| | | | | 74/5.6 D |
| 2014/0208823 A1* | 7/2014 | Trusov | .................. | G01P 15/125 |
| | | | | 73/1.38 |
| 2017/0038211 A1* | 2/2017 | Ayazi | ........................ | H03J 1/06 |
| 2018/0090200 A1* | 3/2018 | Soykal | ................... | G11C 13/04 |

FOREIGN PATENT DOCUMENTS

| | | | | |
|---|---|---|---|---|
| JP | 2017142154 A | * | 8/2017 | |
| KR | 20100042443 A | * | 4/2010 | |
| WO | WO-9947891 A1 | * | 9/1999 | ......... G01C 19/5677 |

* cited by examiner

ACOUSTICALLY DECOUPLED MEMS DEVICES

CROSS-REFERENCE TO RELATED APPLICATIONS

This application is a continuation of U.S. patent application Ser. No. 16/977,827 filed 3 Sep. 2020, which is a National Stage Entry of International Patent Application No. PCT/US19/20752 filed 5 Mar. 2019, which PCT claims the benefit under 35 USC § 119(e), of U.S. Provisional Patent Application No. 62/638,494 filed 5 Mar. 2018, the entire contents and substance of each being incorporated herein by reference in its entirety as if fully set forth below.

STATEMENT REGARDING FEDERALLY SPONSORED RESEARCH OR DEVELOPMENT

This invention was made with Government support under Agreement No. N66001-16-1-4027 awarded by DARPA. The Government has certain rights in the invention.

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE DISCLOSURE

1. Field of the Disclosure

Embodiments of the present disclosure relate generally to inventive resonator elements and acoustically decoupled micro- and nano-microelectromechanical system ("MEMS") devices and, more particularly, to a resonator element comprising the monocrystalline 4H or 6H polytype of silicon carbide (SiC), and acoustically decoupled MEMS devices anchored upon phononic crystals.

2. Background

The pursuit of an ultra-high quality factor (Q) in MEMS devices is of great interest and importance, benefiting a wide range of applications.

In this pursuit, beneficial materials making up the resonator have been sought, as have inventive ways to acoustically decouple the MEMS device (e.g., accelerometer, pressure sensor, gyroscope, clocks, etc.) from the substrate. When coupled, time-varying stress in the substrate can negatively impact the MEMS device performance, by inducing drift for example. Previous systems for acoustically decoupling MEMS devices focused on defining coplanar mesas around the device. The collection of these mesas, when arranged symmetrically with a definable unit-cell, form a phononic crystal. In well-designed phononic crystals, acoustic waves of a certain frequency scatter destructively and cannot propagate energy between the MEMS device and the substrate. These previous, coplanar systems, however, suffer from other mechanisms that degrade the performance of the systems.

The coplanar design of current acoustic-decoupling systems requires a large footprint for the MEMS device. A resonator, for example, in the center of the mesas of the phononic crystal requires sufficient area around the resonator to incorporate the unit-cells of the phononic crystal. This large footprint is only exacerbated if additional circuitry is added to the device, for example electrodes and circuitry for electrodes. Also, placing the resonator and phononic crystal in the same plane inherently requires both features to be manufactured from the same material and with similar dimensions (i.e., thickness). Therefore, with current systems, the characteristics of the MEMS device and the phononic crystal cannot be independently manipulated to improve the characteristics for each component of the system, for example phonon-phonon dissipation for the MEMS device and acoustic dissipation for the phononic crystal. What is needed, therefore, is a system providing an acoustically-decoupled MEMS device that maintains a small footprint, while also providing customizability for the independent components of the device.

BRIEF SUMMARY OF THE DISCLOSURE

Embodiments of the present disclosure address these concerns as well as other needs that will become apparent upon reading the description below in conjunction with the drawings. Briefly described, embodiments of the present disclosure relate generally to acoustically decoupled MEMS devices and, more particularly, to acoustically decoupled MEMS devices anchored upon phononic crystals.

In an exemplary embodiment of the present invention, a resonator element can comprise the monocrystalline 4H polytype of SiC. In an exemplary embodiment of the present invention, the resonator element can comprise the monocrystalline 6H polytype of SiC.

In an exemplary embodiment of the present invention, a MEMS device can comprise the inventive resonator element comprising the monocrystalline 4H or 6H polytype of SiC, and a substrate, wherein the resonator element and the substrate are not coplanar, and wherein acoustic decoupling of the resonator element and the substrate is at least partially dependent upon a degree to which the resonator element and the substrate are not coplanar.

In any of the embodiments described herein, the MEMS device can be a gyroscope, wherein the resonator element operates in gyroscopic modes with frequency above 1 MHz.

In any of the embodiments described herein, the MEMS device can be a gyroscope, wherein the resonator element is a BAW resonator element having gyroscopic modes.

In any of the embodiments described herein, the resonator element of the MEMS device can have a Q greater than 1,000,000.

In any of the embodiments described herein, the resonator element of the MEMS device can be selected from the group of a mechanical resonator and an acoustic resonator.

In any of the embodiments described herein, the resonator element of the MEMS device can be fabricated using lithography-based batch fabrication processing at wafer level.

In any of the embodiments described herein, the resonator element of the MEMS device can be a bulk acoustic wave (BAW) resonator element.

In any of the embodiments described herein, the MEMS device can further comprise transducers disposed proximate the resonator element, wherein the resonator element and transducers are integrated with the substrate.

In any of the embodiments described herein, the transducers of the MEMS device can be selected from the group consisting of a drive transducer, a sense transducer, and a control transducer and all have the same size.

In an exemplary embodiment of the present invention, a MEMS gyroscope can comprise the inventive resonator element comprising the monocrystalline 4H or 6H polytype of SiC, a substrate, and one or more electrodes disposed proximate a surface of the resonator element and a capacitive gap disposed between each electrode and the surface of the resonator element.

In any of the embodiments described herein, the MEMS gyroscope can further comprise an Si wafer, wherein the resonator element comprises a 4H—SiC wafer having a Si-face on one side and a C-face on the other side, and wherein the Si wafer is fusion bonded on the C-face of the 4H—SiC wafer.

In any of the embodiments described herein, each electrode of the MEMS gyroscope can be disposed proximate a perimeter edge of the resonator element, each capacitive gap can be disposed between the electrode and the perimeter edge of the resonator element, and each electrode can be selected from the group consisting of a capacitively-coupled drive electrode, a sense electrode, and a control electrode.

In any of the embodiments described herein, the resonator element of the MEMS gyroscope can have a Q greater than 1,000,000.

In any of the embodiments described herein, the resonator element of the MEMS gyroscope can have gyroscopic modes.

In any of the embodiments described herein, the resonator element of the MEMS gyroscope can be fabricated using lithography-based batch fabrication processing at wafer level.

In any of the embodiments described herein, the resonator element of the MEMS gyroscope is a BAW resonator element.

In any of the embodiments described herein, the MEMS gyroscope MEMS gyroscope can comprise two or more electrodes, wherein each of the electrodes share at least one common characteristic. One common characteristic can be selected from the group consisting of a size and a shape.

In an exemplary embodiment of the present invention, a MEMS device can comprise the inventive resonator element comprising the monocrystalline 4H or 6H polytype of SiC, wherein the resonator element comprises a perimeter edge and has a Q greater than 1,000,000, a phononic crystal substrate, and a gap disposed between the perimeter edge of the resonator element and the phononic crystal substrate, wherein acoustic decoupling of the resonator element and the phononic crystal substrate is at least partially dependent upon a size of the gap.

In any of the embodiments described herein, the MEMS device can further comprise a pedestal having an aspect-ratio and being disposed between the resonator element and the phononic crystal substrate, wherein acoustic decoupling of the resonator element and the phononic crystal substrate is further at least partially dependent by the aspect-ratio of the pedestal.

In another exemplary embodiment of the present invention, a device comprises a resonator comprising a perimeter edge and a first diameter, a handle layer comprising a phononic crystal structure, and a pedestal having a second diameter and connecting the resonator to the handle layer; wherein the second diameter is from between 1% and 10% of the first diameter.

In any of the embodiments described herein, the handle layer are not coplanar.

In any of the embodiments described herein, the handle layer can comprise a plurality of structures etched into the handle layer.

In any of the embodiments described herein, the handle layer can comprise a second material composition that is different from the first material composition.

In any of the embodiments described herein, the handle layer can have a first side proximate the pedestal and a second side, wherein a handle layer thickness is defined between the first side and the second side, and wherein the handle layer thickness is approximately $\lambda/4$, where $\lambda$ is equal to a wavelength of an acoustic wave propagating through the handle layer corresponding to a resonator frequency.

In any of the embodiments described herein, the handle layer can comprise a lattice structure having a plurality of unit-cells. In any of the embodiments described herein, the lattice structure can be a honeycomb lattice structure having a unit-cell length of from between 10 µm and 1500 µm.

In any of the embodiments described herein, the perimeter edge of the resonator can be selected from the group consisting of a circle, square and rectangular.

In any of the embodiments described herein, the resonator can be a gyroscope.

In any of the embodiments described herein, the pedestal can have a first end proximate the resonator and a second end proximate the handle layer, wherein the pedestal length is disposed between the first end and the second end, and wherein the pedestal length is from between 1 µm to 500 µm.

In any of the embodiments described herein, the shape of the pedestal can be selected from the group consisting of a conical frustum and a cylindrical shape.

In any of the embodiments described herein, the resonator can comprise a first material composition comprising at least one of silicon carbide, aluminum nitride, poly crystal line silicon carbide, polycrystalline silicon, diamond, and fused quartz.

In any of the embodiments described herein, the device can further comprise an electrode connected to the handle layer and disposed proximate the perimeter edge of the resonator, and a capacitive gap disposed between the electrode and the resonator.

In any of the embodiments described herein, the capacitive gap can be from between 100 nm and 500 nm.

In any of the embodiments described herein, the electrode can be connected to the handle layer by an electrode pedestal.

In any of the embodiments described herein, the resonator can have a Q greater than 2,000,000.

In another exemplary embodiment of the present invention, a MEMS device comprises a resonator having a perimeter edge, a handle layer comprising a phononic crystal structure, and a pedestal connecting the resonator to the handle layer, wherein the resonator has a first diameter and comprises a gyroscope, and wherein the handle Inver has a second diameter greater than the first diameter.

In any of the embodiments described herein, the resonator and the handle layer of the MEMS device are not coplanar.

In any of the embodiments described herein, the MEMS device can further comprise a gap disposed between the resonator and the handle laver, wherein the handle layer has a first side proximate the pedestal and a second side, wherein a handle layer thickness is defined between the first side and the second side, and wherein the handle layer thickness is approximately λ/4, where λ is equal to a wavelength of an acoustic wave propagating through the handle layer corresponding to a resonator frequency.

In any of the embodiments described herein, the handle layer of the MEMS device can comprise a structure selected from the group consisting of a structure etched into the handle layer and a lattice structure having a plurality of unit-cells.

In any of the embodiments described herein, the handle layer of the MEMS device can comprise a lattice structure comprising at least three unit-cells.

In any of the embodiments described herein, the handle layer of the MEMS device can comprise a honeycomb lattice structure having a unit-cell length of from between 10 m and 1500 m.

In any of the embodiments described herein, the perimeter edge of the resonator can be circular, wherein the handle layer is cylindrical, wherein the first diameter is from between 100 m and 5 mm, and wherein the pedestal has a third diameter from between 1% and 10% of the first diameter.

In any of the embodiments described herein, the perimeter edge of the resonator can be square or rectangular.

In any of the embodiments described herein, the pedestal can have a first end proximate the resonator and a second end proximate the handle layer, wherein a pedestal length is defined between the first end and the second end, and wherein the pedestal length is from between 1 μm to 500 μm.

In any of the embodiments described herein, the MEMS device can further comprise an electrode connected to the handle layer and disposed proximate the perimeter edge of the resonator, and a capacitive gap disposed between the electrode and the resonator.

In any of the embodiments described herein, the capacitive gap can be from between 100 nm and 500 nm.

In another exemplary embodiment of the present invention, a MEMS gyroscope comprises a disk resonator comprising a perimeter edge and having a first diameter, a handle layer comprising a phononic crystal structure, wherein the handle layer comprises a thickness of approximately λ/4, and wherein λ is equal to a wavelength of an acoustic wave propagating through the handle layer corresponding to a disk resonator frequency, and a pedestal disposed between the disk resonator and the handle layer, the pedestal connecting the disk resonator to the handle layer, wherein the pedestal comprises a second diameter, and wherein the second diameter is less than the first diameter.

In any of the embodiments described herein, the gyroscope can further comprise a plurality of electrodes disposed proximate the perimeter edge of the disk resonator, and a capacitive gap disposed between the disk resonator and each electrode of the plurality of electrodes.

In another exemplary embodiment of the present invention, a MEMS gyroscope comprises a disk resonator gyroscope comprising a perimeter edge and having a first diameter, a handle layer comprising a phononic crystal structure, wherein the handle layer comprises a thickness of approximately λ/4, and wherein λ is equal to a wavelength of an acoustic wave propagating through the handle layer corresponding to a disk resonator gyroscope frequency, a pedestal disposed between the disk resonator gyroscope and the handle layer, the pedestal connecting the disk resonator gyroscope to the handle layer, wherein the pedestal comprises a second diameter, and wherein the second diameter is less than the first diameter, a plurality of electrodes disposed proximate the perimeter edge of the disk resonator gyroscope, and a capacitive gap disposed between the disk resonator gyroscope and each of the plurality of electrodes.

In another exemplary embodiment of the present invention, a device may comprise a resonator comprising a perimeter edge. The device may further comprise a handle layer comprising a phononic crystal structure. The device may further comprise a pedestal. The pedestal may be disposed between the resonator and the handle layer. The pedestal may connect the resonator to the handle layer. The device may further comprise a gap disposed between the resonator and the handle layer.

In any of the embodiments described herein, the resonator and the handle layer may be non-coplanar.

In any of the embodiments described herein, the handle layer may comprise a first side and a second side. The first side may be proximate the pedestal. A handle layer thickness may be disposed between the first side and the second side. The handle layer thickness may be approximately λ/4, where λ is equal to a wavelength of an acoustic wave propagating through the handle layer corresponding to a resonator frequency.

In any of the embodiments described herein, the handle layer may comprise a plurality of structures etched into the handle layer.

In any of the embodiments described herein, the handle layer may comprise a lattice structure having a plurality of unit-cells.

In any of the embodiments described herein, the lattice structure may comprise at least three unit-cells.

In any of the embodiments described herein, the lattice structure may be a honeycomb lattice structure. A honeycomb lattice structure may have a unit-cell length of from between 10 μm and 1500 μm.

In any of the embodiments described herein, the resonator may be a gyroscope.

In any of the embodiments described herein, the perimeter edge of the resonator may be circular.

In any of the embodiments described herein, the perimeter edge of the resonator may be square or rectangular.

In any of the embodiments described herein, the resonator may comprise a diameter of from between 100 μm and 5 mm.

In any of the embodiments described herein, the resonator may comprise a first diameter. The pedestal may comprise a second dimeter. The second diameter may be from between 1% and 10% of the first diameter.

In any of the embodiments described herein, the resonator may comprise a width and/or length of from between 100 μm and 5 mm.

In any of the embodiments described herein, the pedestal may comprise a first end and a second end, wherein the first end is proximate the resonator, and wherein the second end is proximate the handle layer. The pedestal may comprise a length disposed between the first end and the second end. The length may be from between 1 μm to 500 μm.

In any of the embodiments described herein, the pedestal may comprise at least one of a conical frustum or a cylindrical shape.

In any of the embodiments described herein, the resonator may comprise at least one of silicon carbide, aluminum nitride, polycrystalline silicon carbide, polycrystalline silicon, diamond, or fused quartz.

In any of the embodiments described herein, the resonator may comprise a first material composition, and the handle layer may comprise a second material composition. In any of the embodiments described herein, the first material composition may be different than the second material composition.

In any of the embodiments described herein, the device may further comprise an electrode connected to the handle layer. The electrode may be disposed proximate the perimeter edge of the resonator. The device may further comprise a capacitive gap disposed between the electrode and the resonator.

In any of the embodiments described herein, the capacitive gap may be from between 100 nm and 500 nm.

In any of the embodiments described herein, the electrode may be connected to the handle layer by an electrode pedestal.

In any of the embodiments described herein, the resonator may have a Q greater than 2,000,000.

Another exemplary embodiment of the present invention provides a MEMS device. The device may comprise a resonator gyroscope comprising a perimeter edge. The device may further comprise a handle layer comprising a phononic crystal structure. The device may further comprise a pedestal. The pedestal may be disposed between the resonator gyroscope and the handle layer. The pedestal may connect the resonator gyroscope to the handle layer. The device may further comprise a gap disposed between the resonator gyroscope and the handle layer.

In any of the embodiments described herein, the resonator gyroscope and the handle layer be non-coplanar.

In any of the embodiments described herein, the handle layer may comprise a first side and a second side. The first side may be proximate the pedestal. A handle layer thickness may be disposed between the first side and the second side. The handle layer thickness may be approximately $\lambda/4$, where $\lambda$ is equal to a wavelength of an acoustic wave propagating through the handle layer corresponding to a resonator gyroscope frequency.

In any of the embodiments described herein, the handle layer may comprise a plurality of structures etched into the handle layer.

In any of the embodiments described herein, the handle layer may comprise a lattice structure having a plurality of unit-cells.

In any of the embodiments described herein, the lattice structure may comprise at least three unit-cells.

In any of the embodiments described herein, the lattice structure may be a honeycomb lattice structure. A honeycomb lattice structure may have a unit-cell length of from between 10 μm and 1500 μm.

In any of the embodiments described herein, the perimeter edge of the resonator gyroscope may be circular.

In any of the embodiments described herein, the resonator gyroscope may comprise a diameter of from between 100 μm and 5 mm.

In any of the embodiments described herein, the resonator gyroscope may comprise a first diameter. The pedestal may comprise a second dimeter. The second diameter may be from between 1% and 10% of the first diameter.

In any of the embodiments described herein, the handle layer may be cylindrical. The resonator gyroscope may comprise a first diameter, and the handle layer may comprise a second dimeter. The second diameter may be greater than the first diameter.

In any of the embodiments described herein, the perimeter edge of the resonator gyroscope may be square or rectangular.

In any of the embodiments described herein, the resonator may comprise a width and/or length of from 100 μm and 5 mm.

In any of the embodiments described herein, the pedestal may comprise a first end and a second end, wherein the first end is proximate the resonator gyroscope, and wherein the second end is proximate the handle layer. The pedestal may comprise a length disposed between the first end and the second end. The length may be from between 1 μm to 500 μm.

In any of the embodiments described herein, the pedestal may comprise at least one of a conical frustum or a cylindrical shape.

In any of the embodiments described herein, the resonator gyroscope may comprise at least one of silicon carbide, aluminum nitride, polycrystalline silicon carbide, polycrystalline silicon, diamond, or fused quartz.

In any of the embodiments described herein, the device may further comprise an electrode connected to the handle layer. The electrode may be disposed proximate the perimeter edge of the resonator gyroscope. The device may further comprise a capacitive gap disposed between the electrode and the resonator gyroscope.

In any of the embodiments described herein, the capacitive gap may be from between 100 nm and 500 nm.

Another exemplary embodiment of the present invention provides a MEMS gyroscope. The MEMS gyroscope may comprise a disk resonator having a perimeter edge. The perimeter edge may have a first dimeter. The MEMS gyroscope may further comprise a handle layer comprising a phononic crystal structure. The handle layer may comprise a thickness of approximately $\lambda/4$, wherein $\lambda$ is equal to a wavelength of an acoustic wave propagating through the handle layer corresponding to a disk resonator frequency. The MEMS gyroscope may further comprise a pedestal disposed between the disk resonator and the handle layer. The pedestal may connect the disk resonator to the handle layer. The pedestal may comprise a second diameter. The second dimeter may be less than the first diameter.

In any of the embodiments described herein, the handle layer may comprise a plurality of structures etched into the handle layer.

In any of the embodiments described herein, the handle layer may comprise a lattice structure having a plurality of unit-cells.

In any of the embodiments described herein, the lattice structure may be a honeycomb lattice structure. The honeycomb lattice structure may have a unit-cell length of from between 10 μm and 1500 μm.

In any of the embodiments described herein, the disk resonator may comprise at least one of silicon carbide, aluminum nitride, polycrystalline silicon carbide, polycrystalline silicon, diamond, or fused quartz.

In any of the embodiments described herein, the MEMS gyroscope may further comprise a plurality of electrodes disposed proximate the perimeter edge of the disk resonator. The MEMS gyroscope may further comprise a capacitive gap disposed between the disk resonator and each electrode of the plurality of electrodes.

In any of the embodiments described herein, the capacitive gap may be from between 100 nm and 500 nm.

In any of the embodiments described herein, at least part of the plurality of electrodes may be configured to actuate the disk resonator.

In any of the embodiments described herein, the disk resonator may have a Q greater than 2,000,000.

Another exemplary embodiment of the present invention provides a MEMS gyroscope. The MEMS gyroscope may comprise a disk resonator gyroscope comprising a perimeter edge and having a first diameter. The MEMS gyroscope may further comprise a handle layer comprising a phononic crystal structure. The handle layer may comprise a thickness of approximately $\lambda/4$, wherein $\lambda$ is equal to a wavelength of an acoustic wave propagating through the handle layer corresponding to a disk resonator gyroscope frequency. The MEMS gyroscope may further comprise a pedestal disposed between the disk resonator and the handle layer. The pedestal may connect the disk resonator gyroscope to the handle layer. The pedestal may comprise a second diameter. The second dimeter may be less than the first diameter. The MEMS gyroscope may further comprise a plurality of electrodes disposed proximate the perimeter edge of the disk resonator gyroscope. The MEMS gyroscope may further comprise a capacitive gap disposed between the disk resonator gyroscope and each of the plurality of electrodes.

In any of the embodiments described herein, the capacitive gap may be from between 100 nm and 10 µm.

In any of the embodiments described herein, the capacitive gap may be from between 100 nm and 500 nm.

In any of the embodiments described herein, at least part of the plurality of electrodes may be sense electrodes.

In any of the embodiments described herein, the plurality of electrodes may be connected to the handle layer by an electrode pedestal.

In any of the embodiments described herein, the handle layer may comprise a plurality of structures etched into the handle layer.

In any of the embodiments described herein, the handle layer may comprise a lattice structure having a plurality of unit-cells.

In any of the embodiments described herein, the lattice structure may be a honeycomb lattice structure. The honeycomb lattice structure may have a unit-cell length of from between 10 µm and 1500 µm.

In any of the embodiments described herein, the disk resonator gyroscope may comprise at least one of silicon carbide, aluminum nitride, polycrystalline silicon carbide, polycrystalline silicon, diamond, or fused quartz.

In any of the embodiments described herein, the disk resonator gyroscope may have a Q greater than 2,000,000.

These and other aspects of the present disclosure are described in the Detailed Description below and the accompanying figures. Other aspects and features of embodiments of the present disclosure will become apparent to those of ordinary skill in the art upon reviewing the following description of specific, example embodiments of the present disclosure in concert with the figures. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments of the disclosure discussed herein. In similar fashion, while example embodiments may be discussed below as device, system, or method embodiments, it is to be understood that such example embodiments can be implemented in various devices, systems, and methods of the present disclosure.

BRIEF DESCRIPTION OF THE DRAWINGS

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

DETAILED DESCRIPTION

Figure 1:
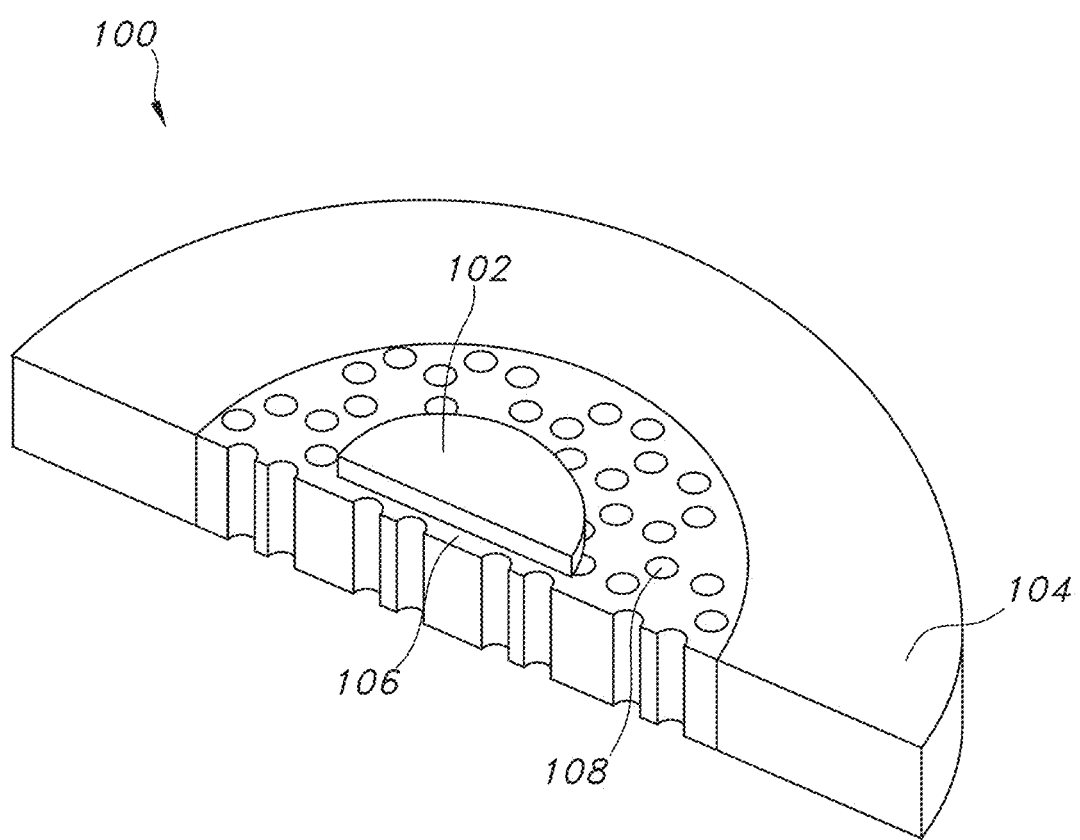
FIG. 1 is a cross-sectional view of an acoustically decoupled device comprising a resonator anchored upon a handle layer, according to an exemplary embodiment of the present disclosure.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

It should also be noted that, as used in the specification and the appended claims, the singular forms "a," "an" and "the" include plural references unless the context clearly dictates otherwise. References to a composition containing "a" constituent is intended to include other constituents in addition to the one named.

Ranges may be expressed herein as from "about" or "approximately" or "substantially" one particular value and/or to "about" or "approximately" or "substantially" another particular value. When such a range is expressed, other exemplary embodiments include from the one particular value and/or to the other particular value.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter. Additionally, the components described herein may apply to any other component within the disclosure. Merely discussing a feature or component in relation to one embodiment does not preclude the feature or component from being used or associated with another embodiment.

To facilitate an understanding of the principles and features of the disclosure, various illustrative embodiments are explained below. In particular, the presently disclosed subject matter is described in the context of acoustically-decoupled resonators and gyroscopes anchored upon phononic crystals. The present disclosure, however, is not so limited and can be applicable in other contexts. For example, and not limitation, some embodiments of the present disclosure may improve the functionality of other electromechanical systems, including but not limited to accelerometers and oscillators. Additionally, although certain materials are described within the present disclosure, the description of those materials is merely exemplary, and other materials for MEMS devices may be used with the presently described systems and methods, as will be appreciated by those having skill in the art. These embodiments are contemplated within the scope of the present disclosure. Accordingly, when the present disclosure is described in the context of acoustically-decoupled resonators and gyroscopes anchored upon phononic crystals, it will be understood that other embodiments can take the place of those referred to.

As described above, the pursuit of ultra-high Qs in micro- and nano-scale MEMS devices is of great interest and importance, benefiting a wide range of applications. BAW disk resonator gyroscopes offer a host of benefits including shock and vibration resilience, high bandwidth and high Q in moderate vacuum environment, thanks to their relatively high operating frequencies (MHz). An ideal resonator is lossless with an infinite Q. Naturally, various physical phenomena exist to siphon energy from the device, limiting its ultimate performance defined by fundamental Akhiezer limit (AKE) phonon-phonon interactions.

An advantageous material for a resonator element can be the monocrystalline 4H or 6H polytype of SiC. For example, the present invention can comprise a MEMS resonator implemented in the monocrystalline 4H or 6H polytype of SiC. Such a design can include characteristics like the acoustic Q of the resonator being higher than 1,000,000. The resonator can also be a BAW type.

As another example, the present invention can comprise a MEMS gyroscope device implemented in the monocrystalline 4H or 6H polytype of SiC. The SiC can be bonded to another wafer. Further, electrodes for actuation and sensing of the device can be included, and each be of equal size and shape. Like the device, such a design can include characteristics like the acoustic Q of the resonator being higher than 1,000,000, and the resonator gyroscope can also be a bulk BAW type.

Clearly, an ideal resonator is lossless with an infinite Q. Naturally, various physical phenomena exist to siphon energy from the device, limiting its ultimate performance defined by fundamental AKE phonon-phonon interactions.

One physical phenomenon that siphons energy from the device is energy loss from the resonator to the substrate. Thus, another inventive aspect of the present invention is to overcome this energy loss with an improved structure with a phononic crystal provided in the substrate to provide a bandgap to impede energy transfer from the resonator to the substrate.

A phononic crystal is a structure composed of stacked acoustically mismatched layers (superlattice) or a tessellation of periodic inclusions in an elastic medium. Analogous to a photonic crystal for electromagnetic radiation, the mismatch of acoustic impedance between the layers or inclusions reflects waves, introducing wave interference which creates the bandgap.

Current methods of incorporating a phononic crystal into a MEMS device comprise locating the device within a substrate, and the substrate surrounding the device composes these inclusions for providing the bandgap. In other words, current systems provide phononic crystals in the same plane as the MEMS device to acoustically decouple the MEMS device from the surrounding substrate. This design is not optimal for micro- or nano-scale devices and is also not optimal for altering the characteristics of both the substrate and the device to maximize the Q and f·Q product.

The present disclosure provides a further inventive feature of a novel MEMS device design that solves the inherent limitations of in-plane phononic crystal designs. As will be discussed in greater detail below, the present systems and devices can provide a MEMS device having a Q in excess of 1,000,000.

Various devices and methods are disclosed for providing an acoustically decoupled MEMS devices anchored upon phononic crystals, and exemplary embodiments of the devices and methods will now be described with reference to the accompanying figures.

FIG. 1 is a cross-sectional view of an acoustically decoupled device 100 comprising a resonator 102 anchored upon a handle layer 104, according to an exemplary embodiment of the present disclosure. In some embodiments, the resonator 102 may be connected to the handle layer 104 by a pedestal 106. In some embodiments, the handle layer 104 may comprise a phononic crystal structure, shown in the figure by the plurality of inclusions 108 creating the phononic crystal structure. As can be seen in the figure, the resonator 102 and the handle layer 104 are non-coplanar. By moving the resonator 102 and handle layer 104 into separate planes, the inclusions 108 may reside between the resonator 102 and the surface of the handle layer 104, i.e., the inclusions 108 may be covered at least in part by the resonator 102. This provides a substantial improvement over previous in-plane or coplanar systems, as coplanar systems require the inclusions 108 of the phononic crystal to be disposed outside the footprint of the resonator 102.

In some embodiments, the inclusions 108 may be proximate the pedestal 106. In some embodiments, additional circuitry, including but not limited circuitry for electrodes, including sense and/or drive electrodes, may be disposed between the resonator 102 and the surface of the handle layer 104, i.e., the circuitry may be covered at least in part by the resonator 102. In other embodiments, circuitry may be disposed on the handle layer 104 in an area outside of the inclusions 108 of the handle layer 104. Exemplary embodiments with electrodes are discussed in greater detail herein. With the current, non-coplanar design, more space is provided around the phononic crystal structure than in a coplanar configuration. As will be appreciated, the phononic crystal structure of the handle layer 104 may be distorted, or altered, to make room for the pedestal 106, electrodes, bonding areas, and/or circuitry. In other words, the inclusions 108 may be adjusted to provide room for each of these features or any other feature disposed between the handle layer 104 and the resonator 102. Therefore, when reference is made to a phononic crystal in this disclosure, it will be understood that, in some embodiments, the phononic crystal structure may be altered in such a way as to include any of these features.

As will be appreciated, the resonator 102 may be any one of a number of MEMS devices, including but not limited to timing resonators, accelerometers, and/or gyroscopes. The non-coplanar design of the present systems may provide distinct benefits for gyroscope devices. In some gyroscope architectures, for example, the Q of Coriolis-coupled resonant modes should match. For various designs, this condition implies a centrally-supported gyroscope. This condition is inherently met when placing the phononic crystal structure (i.e., handle layer 104) in a different plane than the MEMS device (i.e., resonator 102) wherein the two features are connected by a pedestal 106.

The resonator 102 may comprise any material that can be commonly micromachined, including but not limited to polycrystalline silicon, silicon carbide, polycrystalline silicon carbide, germanium, silicon nitride, silicon dioxide, aluminum nitride, alumina, fused quartz and/or diamond. Additionally, the dimensions of the resonator 102 may be manipulated to optimize requirements for the MEMS device. For example, and not limitation, the thickness of the resonator 102 may be altered to optimize frequency requirements. In some embodiments, the thickness of the resonator 102 may be from between 1 µm and 500 µm. In some embodiments, the width of the resonator 102 may also be altered to optimize frequency requirements for the MEMS device. For example, if the resonator is square or rectangular, the width and/or length of the resonator 102 may be altered to adjust the resonant frequency. In some embodiments, the width and/or length of the resonator 102 may be from between 100 µm and 5 mm. In some embodiments, the resonator 102 may be circular, and it is contemplated that the diameter of a circular resonator 102 may be from between 100 µm and 5 mm.

The handle layer 104 may comprise any material that can be commonly micromachined, including but not limited to polycrystalline silicon, silicon carbide, polycrystalline silicon carbide, germanium, silicon nitride, silicon dioxide, aluminum nitride, alumina, fused quartz, and/or diamond. As described herein, because the resonator 102 and the handle layer 104 are non-coplanar, the material of the handle layer 104 (i.e., substrate) is not required to be the same material as the resonator 102. Additionally, the dimensions of the handle layer 104 may be manipulated to optimize requirements for the substrate. For example, and not limitation, the thickness of the handle layer 104 can be optimized to prevent the propagation of out-of-plane energy, as will be discussed in greater detail herein. Again, because the resonator 102 and the handle layer 104 are non-coplanar, the thickness of the handle layer 104 is not required to be the same thickness of the resonator 102. In some embodiments, the thickness of the handle layer 104 may be from between 100 µm and 1500 µm. As will be described in greater detail below, the thickness of the handle layer 104 may correspond to a wavelength of an acoustic wave propagating through the handle layer 104 material corresponding to the resonator 102 frequency. In some embodiments, the width of the handle layer 104 may also be altered to optimize requirements the substrate. This optimization may include, for example, optimizing the overall footprint of the acoustically decoupled device 100. In some embodiments, the width of the handle layer 104 may be from between 30 µm and 30 mm. In some embodiments, holes (not shown in the figure) may be etched on the handle layer 104 at a location covered by the resonator 102 so as to reduce the amount of stiction force the resonator 102 may be required to overcome in the case of high shocks to the device. In some embodiments, these etched holes may improve the shock resistance of the acoustically decoupled device 100. In some embodiments, trenches, divots, and/or other cavities may be disposed on the handle layer 104 at a location covered by the resonator 102 so as to reduce the amount of stiction force. These structures may be disposed upon the handle layer by etching or by any other method known by those having skill in the art.

In some embodiments, the pedestal 106 may connect to the resonator 102 at the center of the resonator 102. In some embodiments, a resonator 102 may be connected to the handle layer 104 by more than one pedestal 106. For example, a single resonator 102 may be anchored to a handle layer 104 not at a centrally-placed pedestal 106, but instead by two or more pedestals 106 connecting the resonator 102 to the handle layer 104. In some embodiments, a single handle layer 104 may support a plurality of resonators 102. For example, and not limitation, a single handle layer 104 may comprise a phononic crystal structure, and a plurality of pedestals 106 may be dispersed between the inclusions 108 of the phononic crystal structure, each pedestal 106 connecting at least one resonator 102 to the shared handle layer 104. Such an embodiment is possible because the systems described herein allow a resonator 102 to cover (or reside above or below) at least some inclusions 108 on the handle layer 104. This may be a significant improvement over co-planar systems. In co-planar systems, two resonators 102 may not be placed adjacent to each other without at least some inclusions 108 between the two resonators to acoustically decouple them. This is another space-conserving capability of the present systems.

Figure 2:
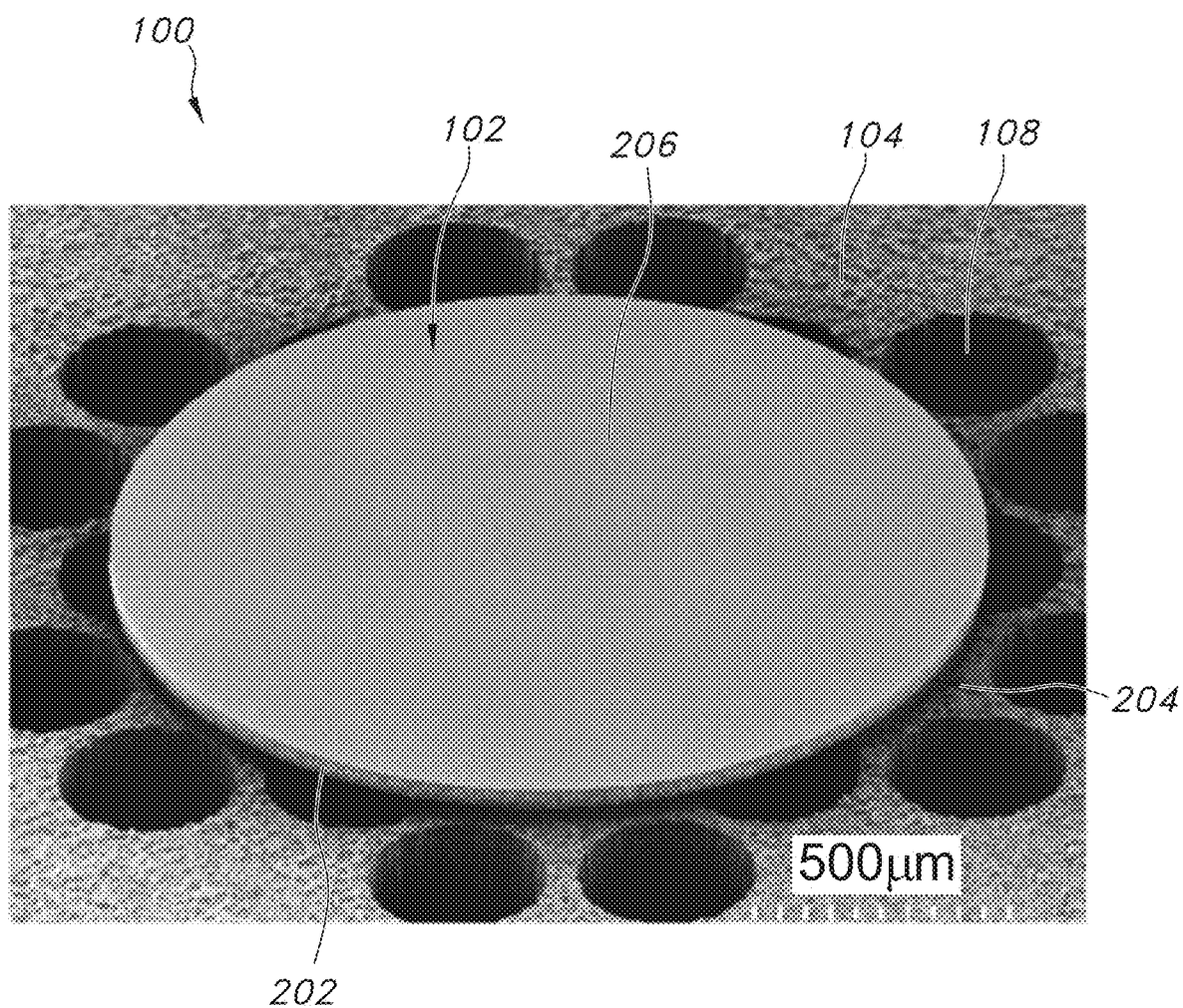
FIG. 2 is a perspective view of an acoustically decoupled device comprising a resonator anchored upon a handle layer, according to an exemplary embodiment of the present disclosure.

FIG. 2 is a perspective view of an acoustically decoupled device 100 comprising a resonator 102 anchored upon a handle layer 104, according to an exemplary embodiment of the present disclosure. A resonator 102 may comprise a perimeter edge 202. The perimeter edge 202 may be separated from the handle layer 104 by a gap 204. The gap 204 may be disposed between the resonator 102 and the handle layer 104 from the perimeter edge 202 to the pedestal 106. In some embodiments, the perimeter edge 202 of the resonator 102 may be circular, as shown in the figure. A perimeter edge 202 that is circular defines a disk-shaped resonator 102. In other embodiments, the perimeter edge 202 of the resonator may comprise other shapes, depending on the use of the device. These perimeter edge 202 shapes may include ovals, squares, rectangles, scalloped designs, and/or other shapes depending on the use of the device. In some embodiments, the handle layer 104 may be circular (as shown in FIG. 1). In other embodiments, the handle layer 104 may be any other shape as described above for the resonator 102. In some embodiments, the handle layer 104 may comprise a greater footprint than the resonator 102, thereby protecting the resonator 102 at the perimeter edge 202 and providing room for additional inclusions 108, circuitry, or any other feature necessary for the device. In the case of a circular resonator 102 and a circular handle layer 104, the diameter of the handle layer 104 may be, in some embodiments, greater than the diameter of the resonator 102.

In some embodiments, a resonator 102 may comprise a surface layer 206 disposed on the side opposite from the pedestal 106 (shown in FIG. 1). In some embodiments, the surface layer 206 may be flat, as shown. The surface layer 206 may also comprise a three-dimensional topography. As described above, the width, length, or diameter of a resonator 102 may be from between 100 μm and 5 mm. In some embodiments, this range of 100 μm to 5 mm may be a length across the surface layer 206 of the resonator 102 from a first point at the perimeter edge 202 to a second point at the perimeter edge, passing over a centrally-placed pedestal 102 (not shown in FIG. 2).

Figure 3:
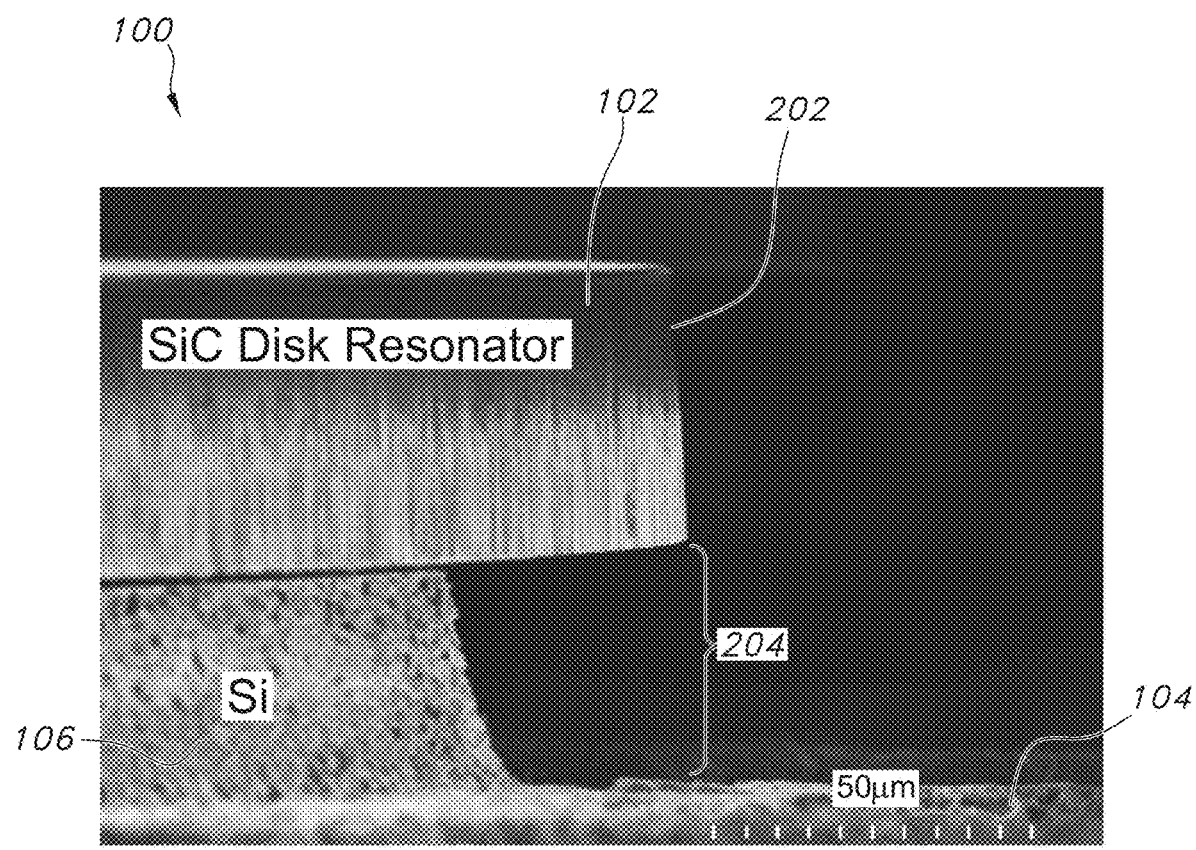
FIG. 3 is a side perspective view of an acoustically decoupled device comprising a resonator anchored upon a handle layer by a pedestal, according to an exemplary embodiment of the present disclosure.

FIG. 3 is a side perspective view of an acoustically decoupled device 100 comprising a resonator 102 anchored upon a handle layer 104 by a pedestal 106, according to an exemplary embodiment of the present disclosure. As described above, in some embodiments, a resonator 102 may be connected to a handle layer 104 by a pedestal 106. The inclusion of an anchor layer, i.e., the pedestal 106, may provide space to incorporate more inclusions 108 (shown in FIGS. 1-2) in the phononic crystal structure of the handle layer 104, additional circuitry, or any other feature and/or component described herein. FIG. 3 depicts an exemplary gap 204 disposed between the perimeter edge 202 of a resonator 102 and the handle layer 104. In some embodiments, the gap 204 is created due to the pedestal 106 having a smaller footprint (diameter in the case of circular devices) than the resonator 102. In some embodiments, a gap 204 may be uniform. For example, and not limitation, the gap 204 between the resonator 102 and the handle layer 104 may be consistent at any location on the surfaces of either component. In some embodiments, the gap 204 between the perimeter edge 202 and the handle layer 104 may be uniform along the entirety of the perimeter edge 202. In other embodiments, the gap 204 may be non-uniform. For example, and not limitation, the handle layer 104, the resonator 102, or both may comprise a three-dimensional shape. In these embodiments, the gap 204 may be smaller at some positions than at other positions between the resonator 102 and the handle layer 104.

In some embodiments, the pedestal 106 may comprise a conical frustum shape, as shown in the figure. In other embodiments, alternative shapes for the pedestal 106 are contemplated, including but not limited to cylinders. The dimensions of the pedestal depend on the desired characteristics of the device. As will be described below, anchor loss is a source of energy loss for an acoustically decoupled device 100 comprising a resonator 102 connected to a handle layer 104 by a pedestal 106. While shrinking the size of the pedestal 106 monotonically mitigates anchor losses, the size of the pedestal 106 cannot be made excessively small to ensure resilience against shock and vibration. Similarly, elongation of the pedestal 106 offers a measure of isolation, but excessive elongation may compromise structural integrity. In some embodiments, the pedestal 106 may have a height (or length from a first end proximate the resonator 102 and a second end proximate the handle layer 104) of from between 1 μm to 500 μm. In some embodiments, the height of the pedestal 106 corresponds to the length of the gap 204. However, it is contemplated that the pedestal 106 may be disposed in a recess either in resonator 102, the handle layer 104, or both. In an embodiment wherein the pedestal 106 connects to the resonator 102 or the handle layer 104 at a recess in either component, the gap 204 at the perimeter of the resonator 102 may be shorter than the height of the pedestal 106. Additionally, it is contemplated that the pedestal 106 may be disposed upon a platform either on the resonator 102, the handle layer 104, or both. In an embodiment wherein the pedestal 106 connects to the resonator 102 or the handle layer 104 at a platform on either component, the gap 204 at the perimeter of the resonator 102 may be larger than the height of the pedestal 106. Altering the height of the pedestal 106 and/or the gap 204 size may provide another parameter to control acoustic decoupling between the resonator 102 and the handle layer 104; the planes of the resonator 102 and the handle layer 104 may be separated even farther by increasing the pedestal 106 height and/or the gap 204 size.

In some embodiments, the width of a pedestal 106 (or diameter in the case of a circular pedestal 106) may be from between 1 μm and 500 μm. In some embodiments, the width of the pedestal 106 may be greater at one end than the other (for example in the case of a conical frustum shape), and either end of the pedestal 106 may fall within that range or any other range that may be beneficial for the device design, as will be appreciated. In some embodiments, the width or diameter of a pedestal 106 may be described in the terms of a percentage of the width or diameter of a resonator 102. For example, in some embodiments, the pedestal 106 may be from between 1% and 90% of the diameter of the resonator 102. In some embodiments, the pedestal 106 may be from between 1% and 10% of the diameter of the resonator 102. The pedestal 106 may be manufactured in whole or in part out of any of the materials described herein, including but not limited to polycrystalline silicon, silicon carbide, polycrystalline silicon carbide, germanium, silicon nitride, silicon dioxide, aluminum nitride, alumina, fused quartz, and/or diamond.

As described above, placing the resonator 102 and the handle layer 104 in different planes can help alleviate many of the pitfalls of coplanar integration for in-plane phononic crystal devices. The benefits of an out-of-plane, non-coplanar device may include varying the material composition and dimensions of the resonator 102 and handle layer 104, this due to the resonator 102 not being manufactured along one substrate surface. However, other concerns, such as the dissipation mechanisms of the device, must be addressed before hitting the AKEs for the MEMS devices. Due to a bulk acoustic wave disk resonator's relatively high operating frequency, in vacuum, disks typically suffer from thermoelastic dissipation and anchor losses.

Thermoelastic dissipation ("TED") occurs in any material that experiences thermal expansion. Three TED operating regimes exist: isothermal, adiabatic, or maximally dissipative (Debye). In elliptical bulk acoustic wave disk resonators at the MEMS scale, the resonant mechanical frequency is highly disparate from the principal thermal mode frequencies, pushing the device into the deep adiabatic regime, minimizing TED to elevate $Q_{TED}$ to 14M for the breathing mode in FEM simulation.

Anchor loss remains as one of the most conspicuous sources of loss, adding unpredictability to the limits of Q. In centrally-anchored disk resonators (such as those described herein with a single pedestal 106), the suppression of anchor loss is particularly difficult due to large elastic strain energy density in the vicinity of the pedestal 106. Substrate-decoupling elements may be incorporated into the device layer; however, this comes at the expense of increased TED due to additional strain at the sites of the occlusions. Therefore, it may be beneficial to implement a three-dimensional (3D) design in which the substrate-decoupling elements lie in the handle layer 104 beneath the disk (resonator 102), leaving the disk unencumbered by TED while eliminating anchor losses. This is where a handle layer 104 comprising a phononic crystal structure may aid to increase the efficiency of the device.

A phononic crystal is a structure composed of stacked acoustically mismatched layers (superlattice) or a tessellation of periodic inclusions in an elastic medium. Analogous to a photonic crystal for electromagnetic radiation, the mismatch of acoustic impedance between the layers or inclusions reflects waves, introducing wave interference which creates the bandgap of the phononic crystal. Two critical parameters determine the behavior and characteristics of the bandgap: the center frequency and bandgap width. The center frequency is defined principally by the characteristic unit-cell length a, typically on the order of the propagating wave's wavelength. The width of the bandgap is heavily affected by the acoustic impedance discrepancy between the propagating medium and the inclusions. Filling factor β (the ratio of the area of the inclusions to the area of the unit-cell) is the primary parameter influencing the width of the gap. A structure's bandgap behavior can be described by its f·a product [Hz·m], as wavelength and frequency are inversely proportional. With increasing filling factor, the bandgap widens.

Figure 4A:
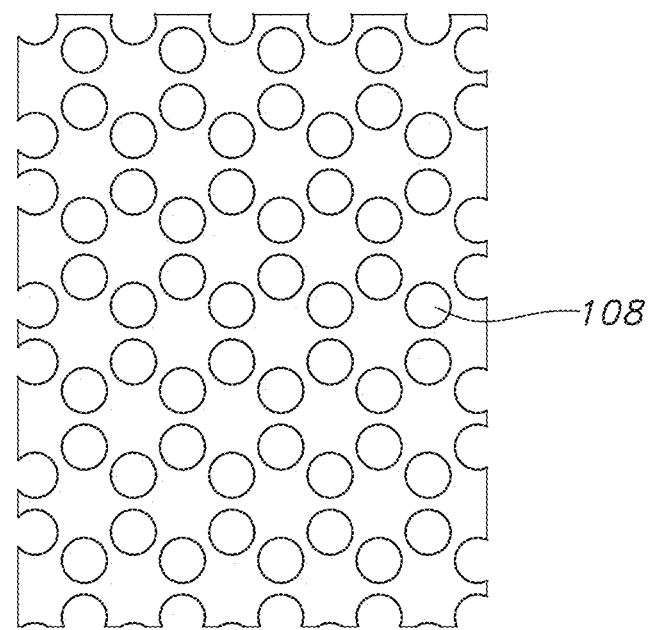
FIG. 4A depicts an exemplary honeycomb lattice structure with inclusions.
Figure 4B:
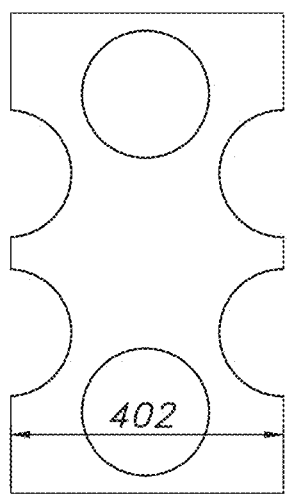
FIG. 4B depicts an exemplary unit-cell length a for a honeycomb lattice.

Any number of lattice structures for a phononic crystal may be employed to impede energy transfer from the resonator 102 to the substrate. Some examples of these lattice structures include, but are not limited to, honeycomb lattices and square lattices. FIGS. 4A and 4B depict an exemplary honeycomb lattice structure. The unit-cell, when placed in a rectangular lattice, creates a honeycomb tessellation. FIG. 4A depicts an exemplary honeycomb tessellation (with inclusions 108). FIG. 4B illustrates an exemplary unit-cell length 402, as described above, for a honeycomb lattice.

Figure 5:
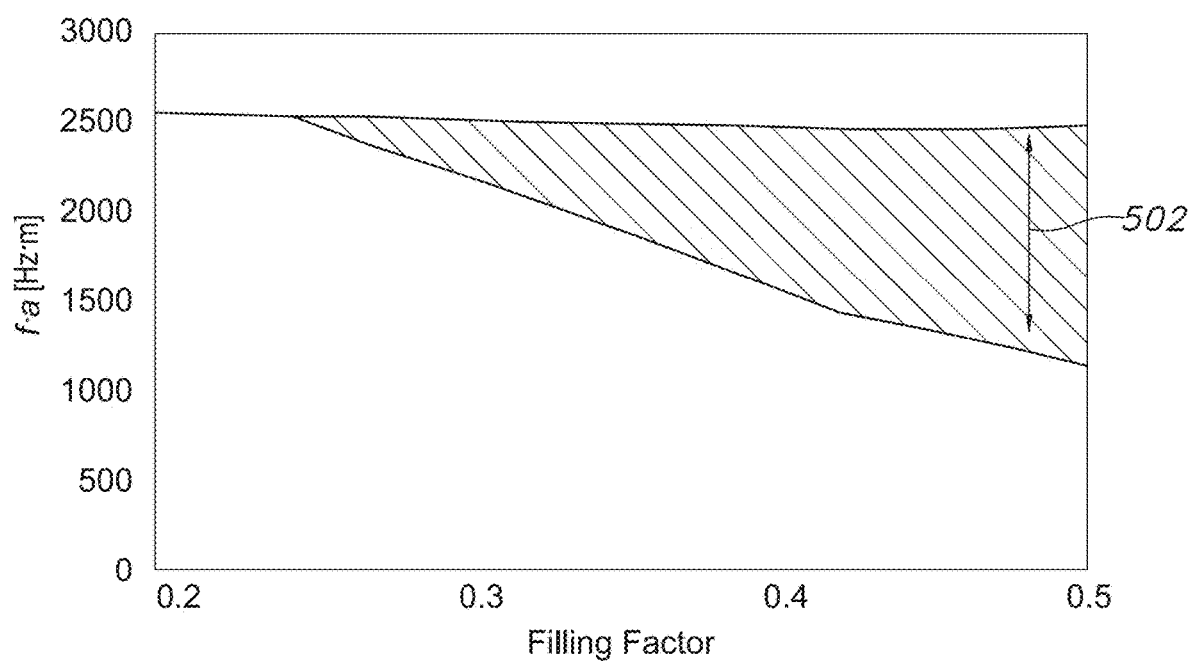
FIG. 5 is a graph showing an exemplary bandgap for a honeycomb lattice structure.

FIG. 5 is a graph showing the bandgap 502 for a honeycomb lattice structure. The X-axis is the filling factor. As shown in the Y-axis, the f·a product [Hz·m] depends on the filling factor. For a given f·a product and a filling factor β, the waves can either propagate (indicated as the colored region in FIG. 5) or not (indicated by the striped region in FIG. 5). All the points within the striped region form the bandgap which depends non-trivially on f, a, and β. The honeycomb lattice has been shown to provide the widest bandgap 502 at the lowest filling factor (the ratio of the area of the inclusions to the area of the unit-cell). As will be appreciated, when decoupling a resonator 102 from the substrate, a wider bandgap is desired to impede energy transfer. Also, a wide bandgap at a low filling factor may be desired for acoustically decoupled device 100: a wide bandgap may be maintained while providing more substrate (less inclusions 108) and thus more structural integrity for the device 100.

Figure 6A:
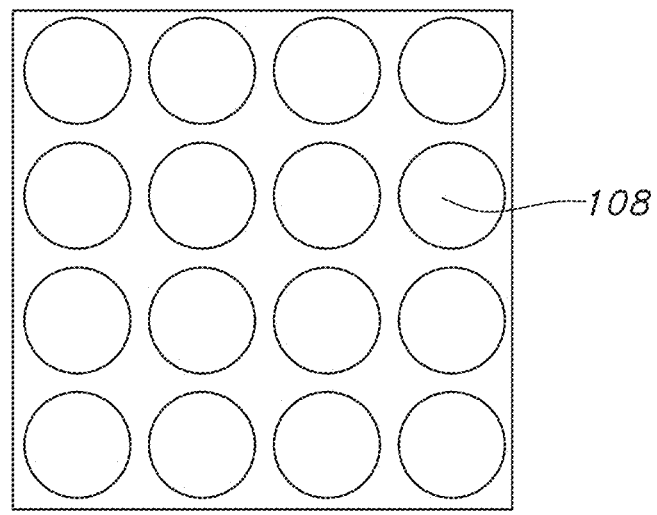
FIG. 6A depicts an exemplary square lattice structure with inclusions.
Figure 6B:
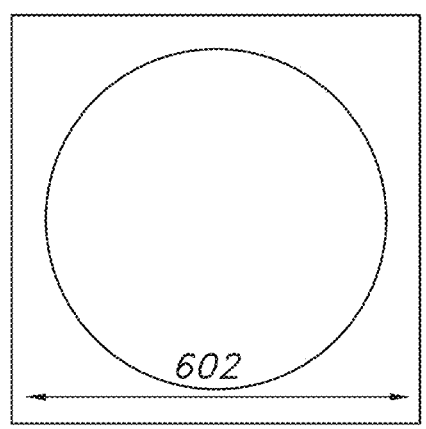
FIG. 6B depicts an exemplary unit-cell length a for a square lattice.
Figure 7:
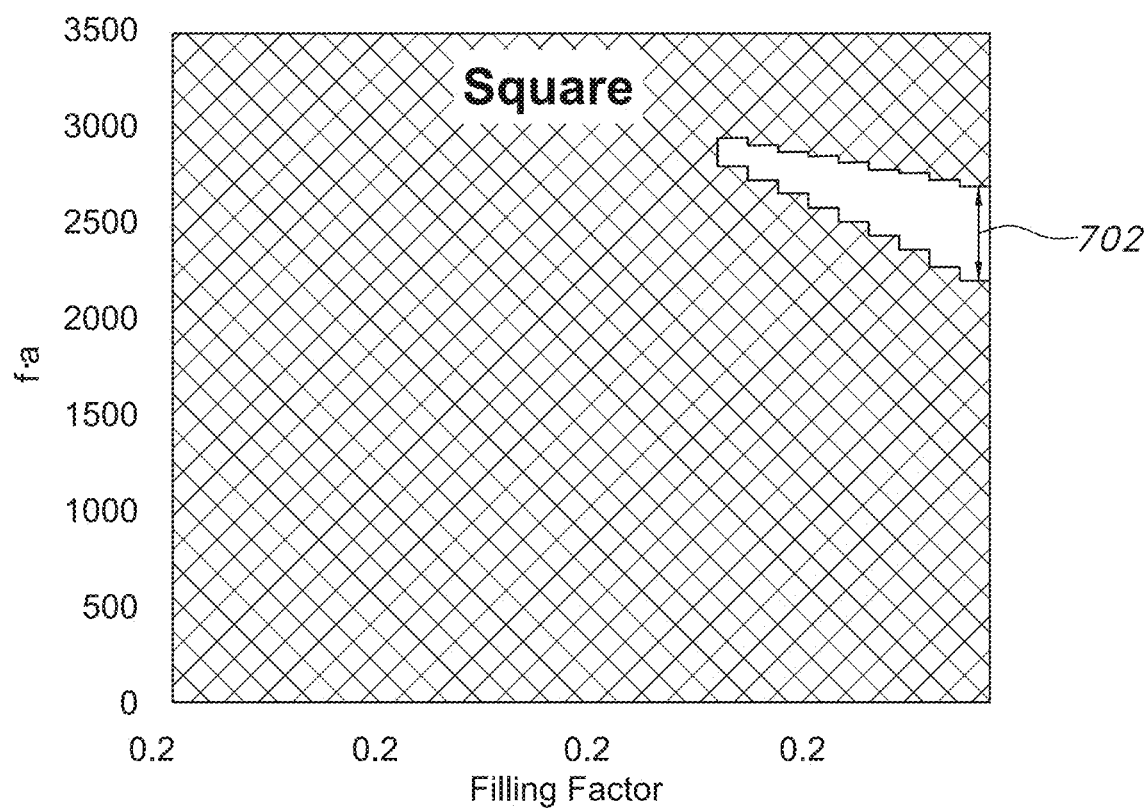
FIG. 7 is a graph showing an exemplary bandgap for a square lattice structure.

As described above, other lattice structures are possible. FIG. 6A depicts an exemplary square lattice structure (with inclusions 108). FIG. 6B illustrates an exemplary unit-cell length 602 for a square lattice. FIG. 7 is a graph showing the bandgap 702 for a square lattice structure. As can be seen, the square lattice structure produces a bandgap 702 beginning at a filling factor of approximately 0.4. The phononic crystal structure of the handle layer 104 of any of the embodiments described herein may be a honeycomb lattice, a square lattice, or any other phononic crystal lattice known by those having skill in the art. In some embodiments, the unit-cell length a (e.g., unit-cell lengths 402, 602) for a lattice structure may be from between 10 µm and 1500 µm. In some embodiments, the lattice structure must be placed in such a way as to preserve the resonant mode symmetry to minimize any frequency split between the gyroscopic resonant modes.

Figure 8:
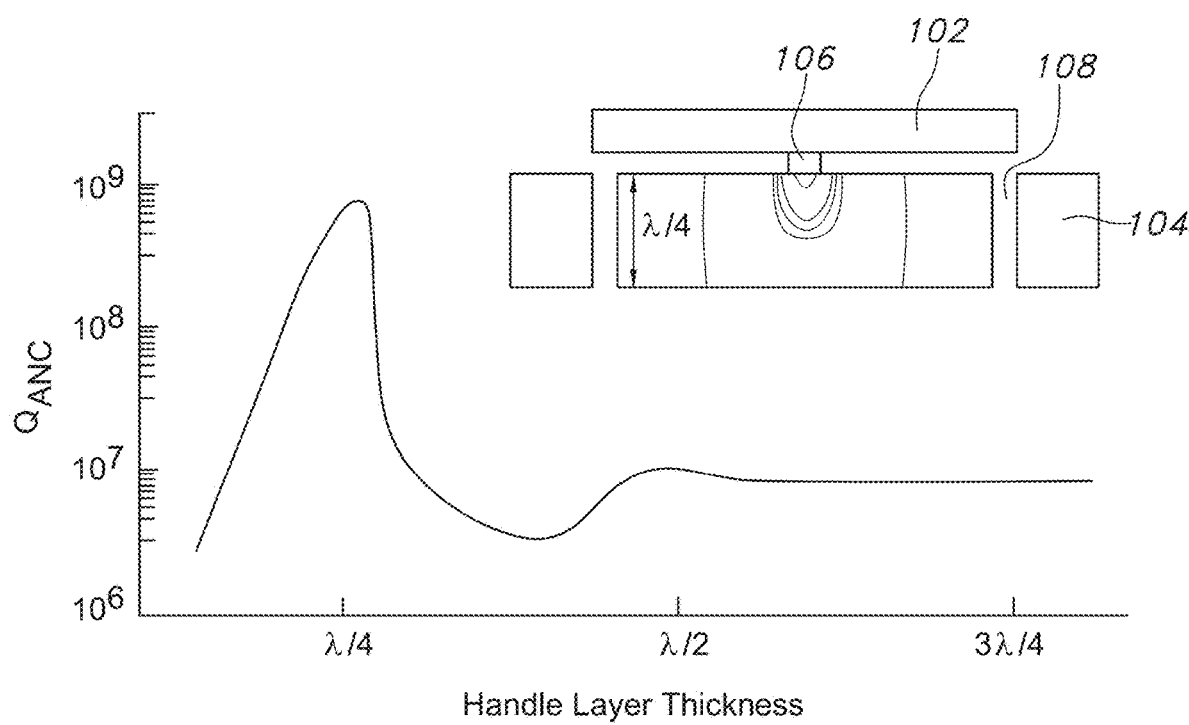
FIG. 8 is a graph showing the relationship of handle layer thickness to $Q_{ANC}$.

Although the phononic crystal design addresses the in-plane issues associated with energy lost to the substrate, other factors may lead to energy loss. Proper vertical out-of-plane decoupling is also a factor that may be addressed to avoid anchor loss. In some embodiments, vertical confinement can be achieved by altering the thickness of the handle layer 104 (or the phononic crystal structure). Handle layer 104 thickness may affect $Q_{ANC}$, and a relationship exists between the thickness of the handle layer 104 and the wavelength of an acoustic wave through the resonator 102, as determined by the frequency of the resonator 102 and the speed of wave propagation through the handle layer 104. FIG. 8 is a graph showing the relationship of handle layer 104 thickness to $Q_{ANC}$. As can be seen at λ/4, wave interference creates a standing wave with a node at the suspended end of the device (i.e., at the pedestal 106). Here, λ equals the wavelength of an acoustic wave propagating through the handle layer 104, and λ corresponds to the frequency of the resonator's 102 resonant mode. Specifically, the thickness H of the handle layer 104 may be defined as $$H \sim \frac{1}{4} * \frac{1}{f} * \sqrt{\frac{E}{\rho}}$$

where E and ρ are the Young's modulus and density of the handle layer 104 and f is the resonant frequency of the resonator 102.

In concert with a phononic crystal, anchor loss can be made negligible by providing a handle layer 104 thickness of λ/4. Therefore, in some embodiments, the handle layer 104 thickness may be approximately λ/4 for any device described herein. Other thicknesses are contemplated, and the functionality of the device is not limited to only devices having a handle layer 104 with a thickness of approximately λ/4. Additionally, handle layer 104 thickness can be optimized independently of the characteristics of the phononic crystal structure (i.e., independent of unit-cell length a and filling factor β).

Figure 9:
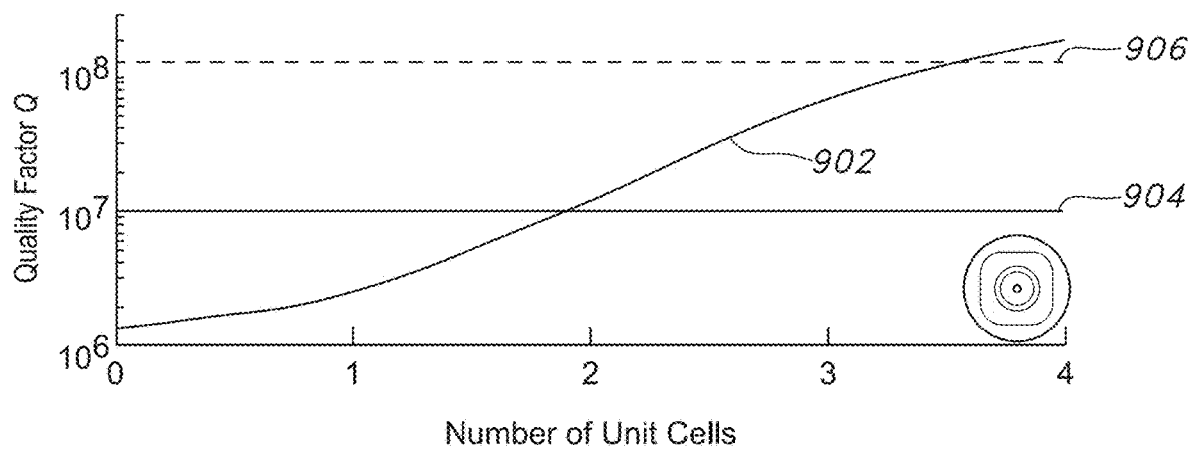
FIG. 9 is a graph showing the relationship between unit-cell quantity and Q.

In perfectly matched layer (PML) simulation, the tandem of quarter wavelength matching and the phononic crystal may offer excellent substrate decoupling. Another consideration that may also affect anchor loss and thermoelastic dissipation is the number of unit-cells within the phononic crystal. Placing more phononic crystal unit-cells in the decoupling layer may provide greater impedance of propagating waves, improving energy confinement. In some embodiments, when a sufficient number of unit-cells are placed around the pedestal 106 of the device, the resonator 102 can be made substrate "deaf," leaving the device limited exclusively by intrinsic dissipation mechanisms such as thermoelastic dissipation and AKE. FIG. 9 is a graph showing the relationship between unit-cell quantity and Q. As shown, as more unit-cells are included in the phononic crystal, $Q_{Anchor}$ 902 surpasses $Q_{TED}$ 904 and finally $Q_{Akhiezer}$ 906. When the phononic crystal approaches three unit-cells, the $Q_{Anchor}$ 902 approaches the AKE. Therefore, in some embodiments, the phononic crystal of the handle layer 104 may comprise at least three unit-cells. In some embodiments however, it is contemplated that the handle layer 104 may comprise less than three unit-cells.

Figure 10A:
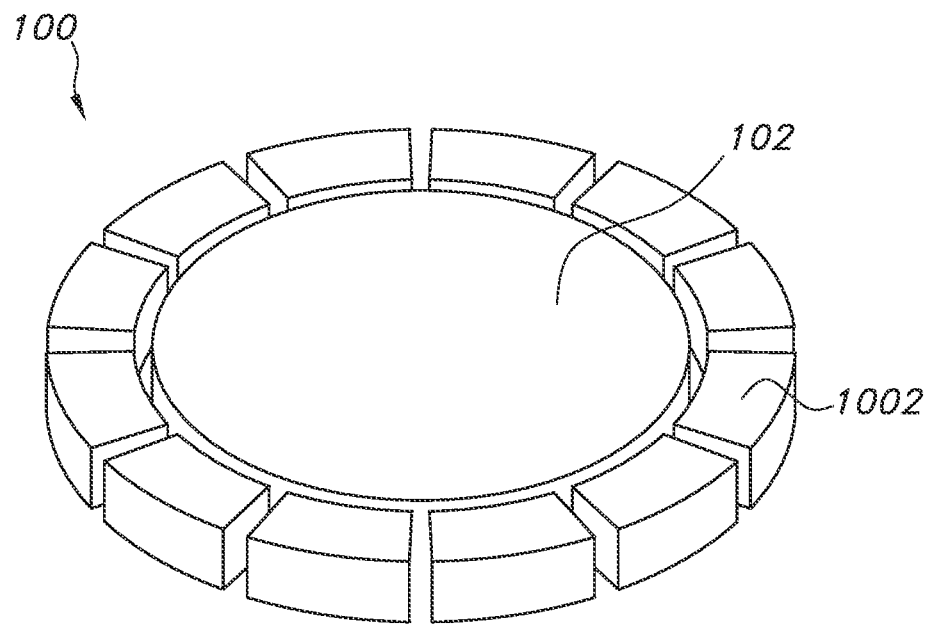
FIG. 10A a perspective view of a MEMS device comprising a resonator and a plurality of electrodes, according to an exemplary embodiment of the present disclosure.
Figure 10B:
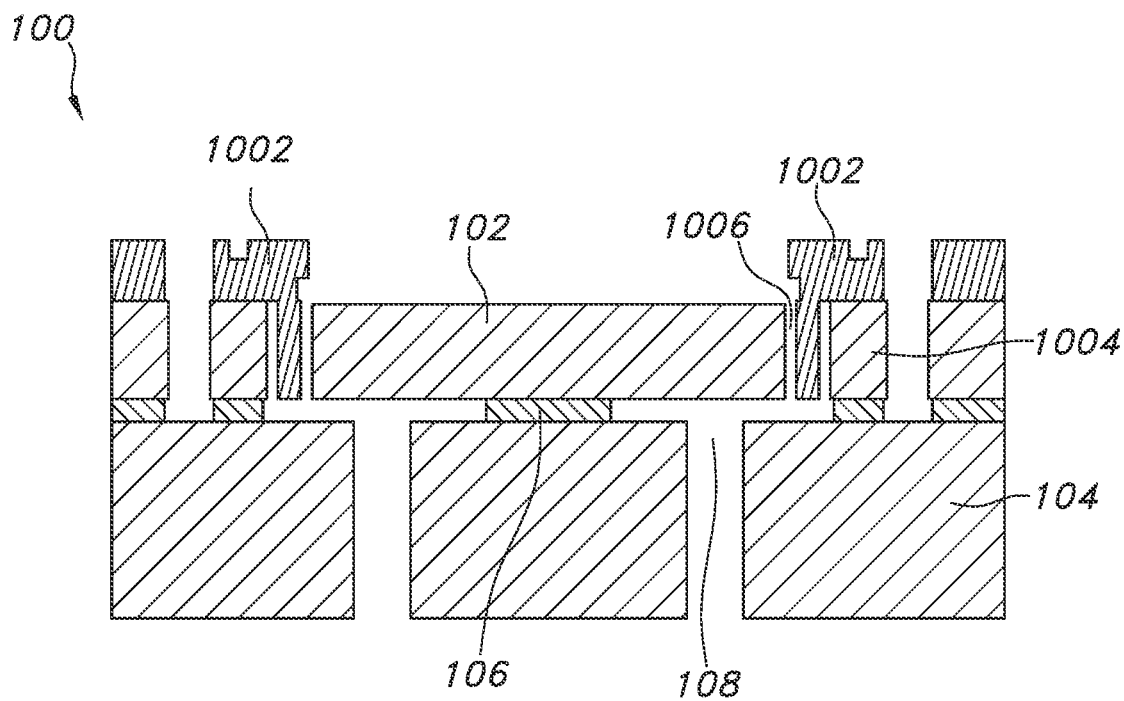
FIG. 10B is a cross-sectional view of an acoustically decoupled device with a resonator connected to a handle layer by a pedestal, wherein the device further comprises electrodes, according to an exemplary embodiment of the present disclosure.

FIGS. 10A and 10B depict an acoustically decoupled device 100 with a plurality of electrodes 1002, according to an exemplary embodiment of the present disclosure. As described above, the current design provides an opportunity to dispose electrodes 1002 about the resonator 102. FIG. 10A is a perspective view of an exemplary an acoustically decoupled device 100 comprising a resonator 102 and a plurality of electrodes 1002, according to an exemplary embodiment of the present disclosure. In some embodiments, one or more electrodes 1002 may be positioned about the resonator 102 in the same plane as the resonator 102. As will be appreciated, in some embodiments these electrodes 1002 may be drive electrodes, sense electrodes, and/or any combination thereof. In some embodiments, a drive electrode 1002 may actuate the resonator 102 by providing a drive voltage signal to the resonator 102.

FIG. 10B is a is a cross-sectional view of an acoustically decoupled device 100 with a resonator 102 connected to a handle layer 104 by a pedestal 106, wherein the device further comprises one or more electrodes 1002, according to an exemplary embodiment of the present disclosure. In some embodiments, a device may comprise one or more electrodes 1002 disposed in the same plane as a resonator 102. In some embodiments, and as described above, the resonator 102 may be connected to the handle layer 104 via a pedestal 102. To position the electrodes 1002 in the same plane as the resonator 102, in some embodiments the electrodes 1002 may be connected to the handle layer 104 by an electrode pedestal 1004. A benefit of the presently described systems is the opportunity to dispose the phononic crystal structure between the resonator pedestal 106 and the electrode pedestals 1004. For example, FIG. 10B shows an inclusion 108 for the phononic crystal structure of the handle layer 104 disposed between the pedestal 106 and the electrode pedestal 1004. Such an embodiment is not possible with coplanar designs. In some embodiments, an electrode pedestal 1004 may be disposed at a location between inclusions 108 of the phononic crystal structure.

In some embodiments, a capacitive gap 1006 may be disposed between the resonator 102 and an electrode 1002. It is contemplated that the capacitive gap 1006 may be from between 100 nm and 10 μm. In some embodiments, the capacitive gap 1006 may be small so as to increase the electromechanical coupling of the system. The presently described systems allow this small gap size because, as described above, the phononic crystal structure of the handle layer 104 may be disposed between the resonator pedestal 106 and an electrode pedestal 1004. In some embodiments, the capacitive gap 1006 may be from between 100 nm and 500 nm.

Experimental Section

The following section discusses an experiment performed on an exemplary acoustically decoupled device, as described herein. With a large stiffness and low average Grüneisen parameter, silicon carbide was determined to be a candidate for ultra-high Q devices as it possesses an $f \cdot Q_{AKE}$ of 6.4× $10^{14}$ Hz, over 30× higher than silicon's. Silicon carbide has many polytypes with cubic, hexagonal, and rhombohedral symmetries. Among commercially available polytypes, atomically smooth monocrystalline 4H—SiC (hexagonally symmetric) wafers exhibit a great degree of isotropicity, making the polytype well-suited to demonstrate ultra-high Q gyroscopic modes in center-supported resonators; therefore, this material was chosen for the tested resonator devices. Notably, the m=3 bulk elliptical gyroscopic modes are fully degenerate in 4H—SiC, critical to mode-matched gyroscopic operation to take full advantage of Q.

SiC-on-insulator (SiCOI) substrates with 100 μm SiC device layer on a 500 μm Si handle layer separated by a thermally grown silicon oxide interlayer were custom-made for the experimentation. To do so, a SiC wafer for the resonator and a silicon wafer for the handle layer were provided. Thermal oxides on both wafers were used as interlayers for bonding as well as buried layers for SiCOI substrates for its higher film density than those of any other deposited oxides.

The 4H—SiC wafer comprised a Si-face on one side and a C-face on the other side. The C-face grows thermal oxide at least eight times faster than Si-face under the same wet oxidation conditions. Thus, Si wafers were fusion bonded on the C-face of 4H—SiC. On-axis 4H—SiC and Si wafers were RCA cleaned and thermally wet oxidized at 1100° C. for six hours.

Then, thermal oxide layers were kiss polished to keep the surface pristine and to reduce the surface roughness to below 1.0 nm RMS. Wafers were brought into contact together after an $O_2/N_2$ plasma treatment, and annealed in an oven at 250° C. Subsequently, bonded wafers were annealed again at 1100° C. to permanently dehydrate and dehydroxylate the buried oxide (BOX) layer. With this fabrication process, 4" and 6" SiCOI substrates with SiC device layer thickness ranging from 10 to 500 μm and Si handle layer thickness ranging from 300 μm to 1 mm can be fabricated with a total thickness variation (TTV) near 1 μm.

After deposition of a Ti/Cu seed layer, the electroplated nickel mask was formed to define the disk resonators; the λ/4 handle layer thickness discussed above prescribed the disk diameter to place the mode of interest at 5 MHz. Nickel was used as a hard mask for the subsequent SiC DRIE step, because of its high selectivity over SiC, near 100:1, dwarfing that of $SiO_2$ (~1:1). The disks were etched in an STS AOE chamber using a mixture of sulfur hexafluoride ($SF_6$) and Argon (Ar) with a large DC bias voltage. Carbon atoms in the SiC react with $SF_6$, forming an inherent passivation layer ($C_xF_y$), enabling anisotropic etching. The remaining nickel mask and any deposition on the sidewall were removed by wet etch.

The phononic crystal geometry was then defined via backside alignment to the SiC layer and etched by a standard Bosch process. This backside 500 μm through-etch produces large amounts of Teflon which can exacerbate anchor losses if not properly cleaned. Using a material with higher acoustic velocity for the handle layer may relax this constraint. Finally, the sacrificial buried oxide layer was laterally etched with HF through the phononic crystal structures doubling as release holes, self-aligning the pedestal with a size controlled by release time. The process yielded a breathing mode disk resonator (1540 μm) supported by a $SiO_2$ pedestal 100 μm (6% of disk size) in diameter. The resonator was anchored upon a phononic crystal comprising three unit-cells, engineered with a unit cell length of 405 m to decouple the 5 MHz radial mode. The pedestal was 2 μm tall, separating the disk resonator from the silicon handle layer below.

The fabricated disks were then mounted upon ultrasonic lithium niobate shear mode piezostages, adhered with Crystalbond. The setup was then placed in a vacuum chamber and pumped down to sub-mTorr. S21 frequency response measurements were taken with a laser Doppler vibrometer in conjunction with a network analyzer. Three devices of varying diameter were tested, each aiming to position the radial, m=3, and m=4 modes at 5 MHz (1.56 mm, 1.7 mm, and 2.21 mm, respectively).

Figure 11:
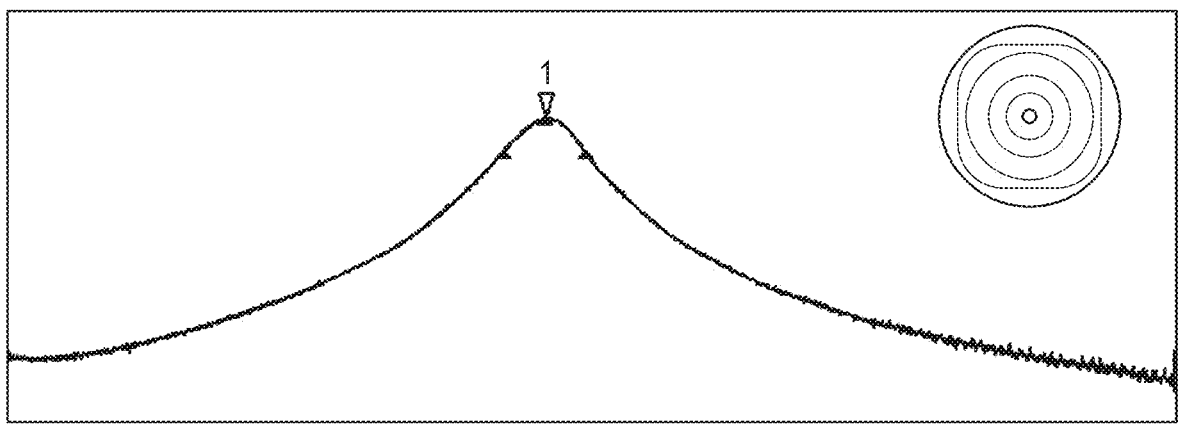
FIG. 11 is a graph presenting the results of testing an exemplary disk resonator anchored upon a handle layer comprising a phononic crystal.

FIG. 11 is a graph presenting the results of testing an exemplary disk resonator having a dimeter of 1.56 mm. As can be seen in the graph, the 1.56 mm disk resonator displayed a breathing mode Q of 3,700,000 at 5 MHz. To date, this is the highest f·Q product ($1.85 \times 10^{13}$ Hz) measured in SiC resonators. Simulated with $Q_{ANC}$=350M and a limiting $Q_{TED}$=14M at 5 MHz, the Q discrepancy arises due to sidewall defects. In contrast, a similar disk resonator (5 mm diameter) anchored upon an unmodified silicon substrate (without a phononic crystal) with smaller anchor diameter (3% of the device diameter) demonstrated a Q of ~1,000,000 at 1.7 MHz. Despite its larger size (less TED) and diminished pedestal area, the lack of any substrate decoupling bounds Q for the 5 mm disk resonator to smaller values.

Figure 12:
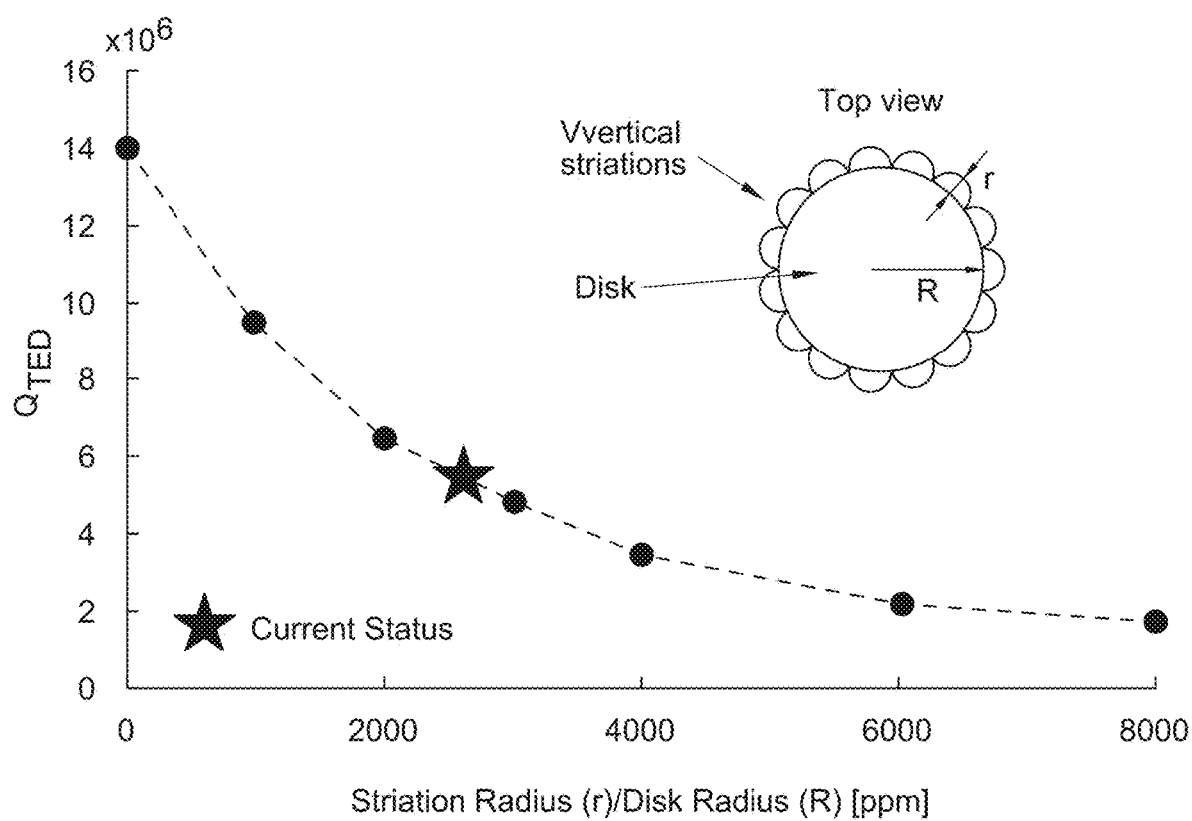
FIG. 12 is a graph showing the relationship between striation radius for the resonator and $Q_{TED}$.

As described above, sidewall defects may lead to Q discrepancies. SEMs of the sidewall of the resonators tested show striations on the micron scale. FIG. 12 is a graph showing the relationship between striation radius for the resonator and $Q_{TED}$. As can be seen, $Q_{TED}$ monotonically decreases with increasing striation size, flattening to Qs in the millions. Horizontal striations appear when etching is disrupted and restarted, and these striation are more easily obviated. Vertical striations, however, may arise from a fusion of different sources: non-uniformities in the nickel mask that propagate during DRIE, in combination with charging in the passivation layer that segregates and directs plasma species imperfectly, may result in a striated sidewall. In simulation, striations are modeled as a hemi-cylindrical defect on the sidewall of the disk, introducing additional strain coupling to thermal fields. The results of this model are presented in FIG. 12. The "current status" located on the map indicates expected defects for the resonators tested in described experimentation.

Figure 13:
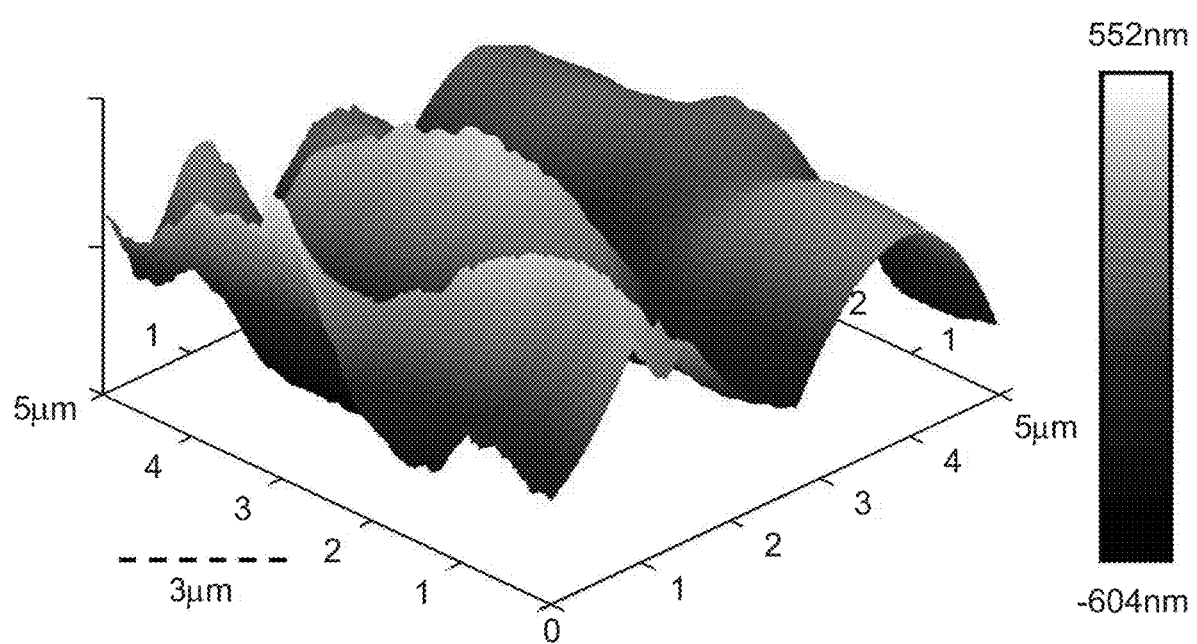
FIG. 13 is an atomic force micrograph of the sidewall of an exemplary disk resonator anchored upon a handle layer comprising a phononic crystal.

FIG. 13 is an atomic force micrograph of the sidewall of the disk resonators tested in the discussion above. The SiC disk resonators, as tested, show defects ranging from 1-3 m in lateral dimension. TED simulations incorporating these defects yield a $Q_{TED}$ of 4.5 M for the radial mode at 5 MHz (as shown in FIG. 11), confirming measurement as a TED limited mode.

The systems described herein provide a novel design that, with nano-scale sidewall roughness fabricated on SiCOI, offer a pathway to extremely high Qs. Monocrystalline SiC bulk acoustic wave resonators offer low intrinsic material dissipation. Consequently, implementing a 3D substrate-decoupled handle layer-leaving the disk itself unblemished-unlocks the possibility of fabricating disk resonators with Qs tethered to intrinsic quantum limits in excess of 100M. Additionally, the resonators tested, even with potential vertical striations, displayed a breathing mode Q of 3,700,000 at 5 MHz. To date, this is the highest f·Q product ($1.85 \times 10^{13}$ Hz) measured in SiC resonators.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A MEMS device comprising:
    a resonator element having a frequency and comprising a transversely isotropic monocrystalline material; and
    a quarter-wavelength matched phononic crystal substrate; wherein:
        the resonator element is anchored to the quarter-wavelength matched phononic crystal substrate;
        the resonator element and the quarter-wavelength matched phononic crystal substrate are not coplanar;
        the resonator element and the quarter-wavelength matched phononic crystal substrate are configured to preserve resonant mode symmetry to minimize frequency split between resonant modes; and
        acoustic decoupling of the resonator element and the quarter-wavelength matched phononic crystal substrate is at least partially dependent upon the frequency of the resonator element.

2. The MEMS device of claim 1, wherein the resonator element has a quality factor (Q) greater than 5,000,000.

3. The MEMS device of claim 1, wherein the resonator element comprises the monocrystalline 4H or 6H polytype of silicon carbide (SIC).

4. The MEMS device of claim 1, wherein the resonator element is fabricated using lithography-based batch fabrication processing at wafer level.

5. The MEMS device of claim 1, wherein the resonator element is a bulk acoustic wave (BAW) resonator element.

6. The MEMS device of claim 1 further comprising:
a pedestal having an aspect-ratio and being disposed between the resonator element and the quarter-wavelength matched phononic crystal substrate;
wherein:
the MEMS device is gyroscope;
the acoustic decoupling is further at least partially dependent by the aspect-ratio of the pedestal; and
the resonator element operates in gyroscopic modes with frequency above 1 MHz.

7. The MEMS device of claim 6, wherein the resonator element is a BAW resonator element having gyroscopic modes.

8. The MEMS device of claim 7 further comprising:
transducers disposed proximate the BAW resonator element;
wherein the BAW resonator element and transducers are integrated with the quarter-wavelength matched phononic crystal substrate.

9. The MEMS device of claim 8, wherein each of the transducers is selected from the group consisting of a drive transducer, a sense transducer, and a control transducer.

10. The MEMS device of claim 9, wherein each of the transducers have the same size.

11. The MEMS device of claim 1 further comprising:
one or more electrodes disposed proximate a surface of the resonator element; and
a capacitive gap disposed between each electrode and the surface of the resonator element.

12. The MEMS device of claim 11 further comprising:
an Si wafer;
wherein:
the resonator element comprises a 4H-SiC wafer having a Si-face on one side and a C-face on the other side; and
the Si wafer is fusion bonded on the C-face of the 4H-SiC wafer.

13. The MEMS device of claim 11, wherein:
each electrode is disposed proximate a perimeter edge of the resonator element;
each capacitive gap is disposed between the electrode and the perimeter edge of the resonator element; and
each electrode is selected from the group consisting of a capacitively-coupled drive electrode, a sense electrode, and a control electrode.

14. The MEMS device of claim 13, wherein the resonator element has a quality factor (Q) greater than 5,000,000.

15. The MEMS device of claim 13, wherein the resonator element has gyroscopic modes.

16. The MEMS device of claim 13, wherein the resonator element is fabricated using lithography-based batch fabrication processing at wafer level.

17. The MEMS device of claim 13, wherein the resonator element is a bulk acoustic wave (BAW) resonator element.

18. The MEMS device of claim 13 comprising two or more electrodes;
wherein each of the electrodes share at least one common characteristic.

19. The MEMS device of claim 18, wherein one common characteristic is selected from the group consisting of a size and a shape.

20. A MEMS device comprising:
a resonator element having a frequency and comprising a transversely isotropic monocrystalline material with a perimeter edge and having has a quality factor (Q) greater than 5,000,000;
a quarter wavelength-matched phononic crystal substrate; and
a gap disposed between the perimeter edge of the resonator element and the quarter wavelength-matched phononic crystal substrate;
wherein:
a native frequency split and a quality factor mismatch are minimized by preserving resonant mode symmetry; and
acoustic decoupling of the resonator element and the quarter-wavelength matched phononic crystal substrate is at least partially dependent upon;
a size of the gap; and
the frequency of the resonator element.

21. The MEMS device of claim 20 further comprising:
a pedestal having an aspect-ratio and being disposed between the resonator element and the quarter-wavelength matched phononic crystal substrate;
wherein acoustic decoupling of the resonator element and the quarter-wavelength matched phononic crystal substrate is further at least partially dependent by the aspect-ratio of the pedestal.

* * * * *